(12) United States Patent
Kim et al.

(10) Patent No.: US 7,839,709 B2
(45) Date of Patent: Nov. 23, 2010

(54) SEMICONDUCTOR MEMORY DEVICE HAVING I/O UNIT

(75) Inventors: Jae-Il Kim, Kyoungki-do (KR); Chang-Ho Do, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 410 days.

(21) Appl. No.: 12/005,919

(22) Filed: Dec. 28, 2007

(65) Prior Publication Data
US 2008/0310240 A1 Dec. 18, 2008

(30) Foreign Application Priority Data
Jun. 13, 2007 (KR) ............... 10-2007-0057692

(51) Int. Cl.
*G11C 29/00* (2006.01)
*G11C 7/00* (2006.01)
(52) U.S. Cl. .................. 365/201; 365/189.05
(58) Field of Classification Search .......... 365/201, 365/189.05, 189.08, 191, 194
See application file for complete search history.

(56) References Cited

U.S. PATENT DOCUMENTS

| | | | |
|---|---|---|---|
| 5,787,097 A * | 7/1998 | Roohparvar et al. | 714/722 |
| 5,864,510 A | 1/1999 | Nakaoka | |
| 6,546,512 B1 | 4/2003 | Ochoa et al. | |
| 2003/0188238 A1 | 10/2003 | Partsch et al. | |
| 2005/0213397 A1 | 9/2005 | Santin | |
| 2006/0123291 A1 | 6/2006 | Kim | |
| 2007/0121397 A1 * | 5/2007 | Lee et al. | 365/201 |
| 2007/0260925 A1 * | 11/2007 | Do | 714/30 |

FOREIGN PATENT DOCUMENTS

| KR | 100269299 | 7/2000 |
|---|---|---|
| KR | 1020050011942 | 1/2005 |

* cited by examiner

*Primary Examiner*—Anh Phung
(74) *Attorney, Agent, or Firm*—Blakely, Sokoloff, Taylor & Zafman

(57) ABSTRACT

A semiconductor memory device is capable of reducing a test time upon the same condition of the actual operation thereof. The semiconductor memory device includes an output data select unit and a data output unit. The output data select unit selectively outputs valid data, which are loaded on a plurality of global lines, in response to an output control signal activated after a delay time corresponding to an additive latency from entry of a read operation in a test mode. The data output unit aligns data outputted from the output data select unit and outputs the aligned data through data pads.

22 Claims, 9 Drawing Sheets

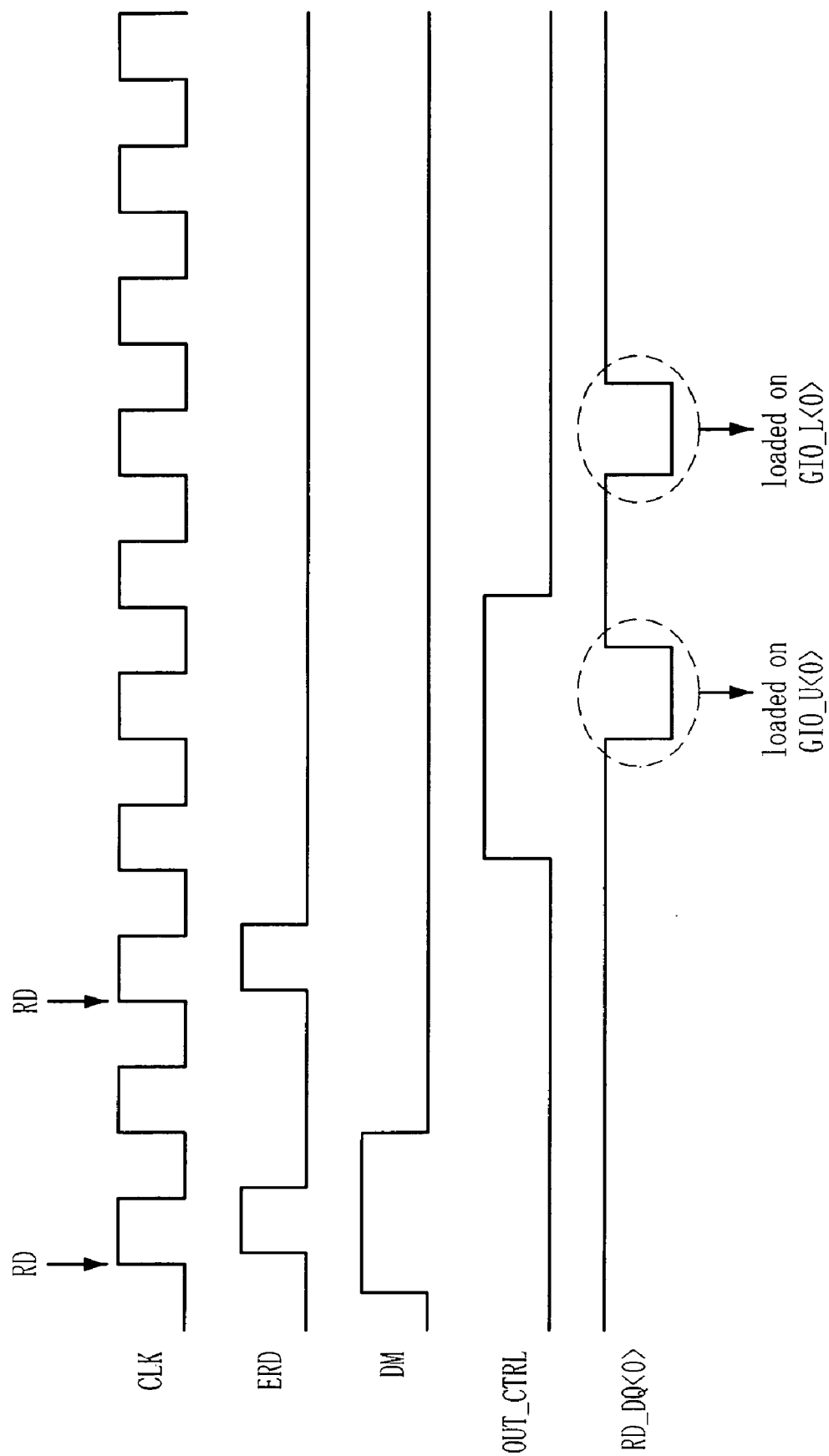

SEMICONDUCTOR MEMORY DEVICE HAVING I/O UNIT

CROSS-REFERENCE TO RELATED APPLICATIONS

The present invention claims priority to Korean patent application number. 10-2007-0057692, filed on Jun. 13, 2007, which is incorporated by reference in its entirety.

BACKGROUND OF THE INVENTION

The present invention relates to a semiconductor design technology, and more particularly to a semiconductor memory device to input and output data and an external signal.

Generally, synchronous semiconductor memory devices perform a signal process operation such that data are stored in memory cells and read out from the cells according to the defined regulation using clock, address, command and data inputted from an external circuit.

In order to use the clock, address, command and data which are applied to the synchronous semiconductor memory devices, it is required to convert the signal characteristics. An input buffer is used for the conversion of the signal characteristics. A semiconductor memory device, which includes the input buffer for the signal characteristics, will be described below.

FIG. 1 illustrates a block diagram of a conventional semiconductor memory device including an I/O unit. Particularly, in FIG. 1, a path between a DQ pad and a data line is depicted at the time of read and write.

The I/O unit of the conventional semiconductor memory device includes a DM pad 10 for receiving a data mask signal DM; a mask input unit 20 for converting output signals of the DM pad 10 into internal voltage signals and aligning them to output alignment mask signals ALGN_DM<0:3>; a DM sense amplifier 25 for sensing and amplifying the alignment mask signals ALGN_DM<0:3> to output mask control signals DM_CTRL<0:3>; a DQ pad 30 for inputting and outputting data DQ; a data input unit 40 for converting output signals of the DQ pad 30 into internal voltage signals and aligning them in order to output alignment data ALGN_DQ<0:3>; a DIN select unit 50 for selecting one from the plurality of the alignment data ALGN_DQ<0:3> in response to write address information signals ADD_WT<13> and ADD_WT<11>; a DIN sense amplifier 55 for sensing and amplifying the selected data from the DIN select unit 50 and applying the amplified signal to global lines GIO_L0<0:3>; a plurality of write driving units 82 for selectively applying data, which are loaded on the corresponding global line GIO_L0<0:3>, to the corresponding data lines LIO in response to the mask control signals DM_CTRL<0:3>; a plurality of read driving units 84 for sensing and amplifying data loaded on the corresponding data lines LIO and applying the amplified data to the corresponding global lines GIO_L0<0:3>; a DOUT select unit 60 for selectively receiving the data loaded on the plurality of the global lines GIO_L0<0:3>, GIO_U0<0:3>, GIO_L7<0:3> and GIO_U7<0:3> in response to bandwidth signals (X16 and X4), a write/read signal WTRDB, an output enable signal PINMUXB and a read address information signals GAX13 and GAY11; and the data output unit 70 for aligning output signals RD_DQ<0:3> of the DOUT select unit 60 and outputting them to the DQ pad 30.

The mask input unit 20 includes a DM buffer unit 22 for converting output signals of the DM pad 10 into internal voltage signals in order to produce internal mask signals INT_DM and a DM alignment unit 24 for aligning the internal mask signals INT_DM in order to output them as the alignment mask signals ALGN_DM<0:3>.

The data input unit 40 includes a DQ buffer unit 42 for converting the output signals of the DQ pad 30 into the internal voltage signals in order to produce internal data signals INT_DQL0 and a DQ alignment unit 44 for aligning output signal of the DQ buffer unit 42 in order to output them as the alignment data ALGN_DQ<0:3>. The data output unit 70 includes a pipe latch unit 74 for aligning the output signals RD_DQ<0:3> of the DOUT select unit 60 to a serial data SR_DQ and a driving unit 72 for driving the serial data SR_DQ to the DQ pad 30.

At a write operation, the DQ pad 30, the data input unit 40, the DIN select unit 50, the plurality of write driving units 82 and the DIN sense amplifier 55 are involved in a data input path and the DM pad 10, the mask input unit 20 and the DM sense amplifier 25 are involved in a mask control signal input path. Moreover, at a read operation, the reading driving unit 84, the DOUT select unit 60 and the data output unit 70 are involved in a data output path.

Meanwhile, in the above-mentioned semiconductor memory device, the data inputted into the DQ pad 30 are respectively applied to the corresponding global lines GIO_L0<0:3>. At this time, the data applied to the global lines GIO_L0<0:3> are changed according to data widths such as 4-bit X4, 8-bit X8 and 16-bit X16. Therefore, the relationship between the DQ pad LDQ0 to LDQ7 and UDQ0 to UDQ7 and the global lines GIO_L0 to GIO_L7 and GIO_U0 to GIO_U7 will be illustrated below based on the data widths X4, X8 and X16 and the operation of the conventional semiconductor memory device will be illustrated.

FIG. 2A illustrates a schematic circuit diagram of an interconnection between the data pads and the global lines in the case of the 16-bit (X16) data width. The DQ pads are coupled to the global lines, respectively. For example, the global line GIO_U0 is coupled to the DQ pad UDQ0 and the global line GIO_L0 is coupled to the DQ pad LDQ0.

Moreover, FIG. 2B illustrates a schematic circuit diagram of an interconnection between the data pads and the global lines in the case of the X8 data width. As shown in FIG. 2B, the global lines GIO_L0 to GIO_L7 and GIO_U0 to GIO_U7 are coupled to only 8 lower pads LDQ0 to LDQ7 of the 16 DQ pads. At this time, upper and lower global lines GIO_L and GIO_U are coupled to one DQ pad LDQ. For example, the DQ pad LDQ0 is coupled to both the upper global line GIO_U0 and the lower global line GIO_L0 and the DQ pad LDQ7 is coupled to the upper global line GIO_U7 and the lower global line GIO_L7. The selection of the global lines commonly coupled to the DQ pads is achieved by the address signals.

Moreover, FIG. 2C illustrates a schematic circuit diagram of an interconnection between the data pads and the global lines in the case of the X4 data width. As shown in FIG. 2C, the global lines GIO_L0 to GIO_L7 and GIO_U0 to GIO_U7 are coupled to only 4 lower pads LDQ0, LDQ1, LDQ2 and LDQ3 of the 16 DQ pads. At this time, two pairs of global lines (two lower global lines and two upper global lines) are coupled to one DQ pad LDQ. For example, the DQ pad LDQ0 is coupled to a pair of the upper and lower global lines GIO_U0 and GIO_L0 and another pair of the upper and lower global lines GIO_U7 and GIO_L7.

As described above, according to the selection of a user, the connection of the DQ pads and the global lines is controlled so that the semiconductor memory device operates in the X16, X8 or X4 data width. In this way, in order to control the interconnection of the global lines, the DQ pads driven in the X16 data width are respectively coupled to the corresponding global lines and the DQ pads driven in the X16 and X8 data widths are coupled to the upper and lower global lines. Finally, the DQ pads which are driven in the X16, X8 and X4 data widths are coupled to the four global lines. For example, in case of the DQ pad UDQ7 driven only in the x16 data width, the DQ pad UDQ7 is coupled to the global line GIO_U7 and the DQ pad LDQ7 driven only in X16 and X8 data widths is coupled to both the upper global line GIO_U7 and the lower global line GIO_L7. Moreover, the DQ pad LDQ0 driven in the X16, X8 and X4 data widths is coupled to the global lines GIO_U7, GIO_L7, GIO_U0 and GIO_L0.

As mentioned above, in case that a plurality of global lines are coupled to one DQ pad, the DIN select unit 50 and the DOUT select unit 60 contribute to the control of the selective interconnection in order to make only one global line coupled to the DQ pad. Therefore, the internal circuit of the DOUT select unit, which makes one of the plurality of global lines coupled to the DQ pad at the read operation, will be described.

FIG. 3 illustrates a schematic circuit diagram of the DOUT select unit 60 described in FIG. 1. Particularly, the DOUT select unit will be illustrated based on one-bit data of the plurality of multiple-bit data.

The DOUT select unit 60 includes a first data select unit 62 for outputting the data loaded on the global line GIO_U0<0> in response to the read address information signals GAX13 and GAY11 in case that the bandwidths are X8 and X4; a second data select unit 64 for outputting the data loaded on the global line GIO_L0<0> in response to the read address information signals GAX13 and GAY11 in case that the bandwidths are X16, X8 and X4; a third data select unit 66 for outputting the data loaded on the global line GIO_U7<0> in response to the read address information signals GAX13 and GAY11 in case the bandwidth is X4; a fourth data select unit 68 for outputting the data loaded on the global line GIO_L7<0> in response to the read address information signals GAX13 and GAY11 in case that the bandwidth is X4; and a latch 69 for inverting and latching a common node output of the first to fourth select units 62, 64, 66 and 68 and for outputting it as a read data RD_DQ<0>.

The first data select unit 62 includes a first NOR gate NR1 for receiving a 16-bit bandwidth signal X16 and the read address information signal GAX13; a first inverter I1 for inverting the read address information signal GAY11, a second inverter I2 for inverting the 16-bit bandwidth signal X16; a second NOR gate NR2 for receiving the write/read signal WTRDB and the output enable signal PINMUXB; a first NAND gate ND1 for receiving output signals of the second NOR gate NR2 and the second inverter I2; a third inverter I3 for inverting an output signal of the first NAND gate ND1; a second NAND gate ND2 for receiving output signals of the first and second inverters I1 and I3 and the first NOR gate NR1, a fourth inverter I4 for outputting a first control signal by inverting an output signal of the second NAND gate ND2; and a first transfer gate TG1 for transferring the data loaded on the global line GIO_U0<0> when the first control signal is activated.

The second data select unit 62 includes the first NOR gate NR1 commonly included in the first data select unit 62 for receiving the 16-bit bandwidth signal X16 and the read address information signal GAX13; a fifth inverter I5 for inverting the output signal of the first NOR gate NR1; the first inverter I1 commonly included in the first data select unit 62 for inverting the read address information signal GAY11; the second NOR gate NR2 commonly included in the first data select unit 62 for receiving the write/read signal WTRDB and the output enable signal PINMUXB; a third NAND gate ND3 for receiving output signals of the first and fifth inverters I1 and I5 and the second NOR gate NR2; a sixth inverter I6 for outputting a second control signal by inverting an output signal of the third NAND gate ND3; and a second transfer gate TG2 for transferring the data loaded on the global line GIO_L0<0> when the second control signal is activated.

The third data select unit 66 includes the first NOR gate NR1 commonly included in the first data select unit 62 for receiving the 16-bit bandwidth signal X16 and the read address information signal GAX13; the first inverter I1 commonly included in the first data select unit 62 for inverting the read address information signal GAY11, an eighth inverter I8 for inverting the output signal of the first inverter I1; the second NOR gate NR2 commonly included in the first data select unit 62 for receiving the write/read signal WTRDB and the output enable signal PINMUXB; a fourth NAND gate ND4 for receiving a 4-bit bandwidth signal X4 and the output of the second NOR gate NR2, an seventh inverter I7 for inverting an output signal of the fourth NAND gate ND4; a fifth NAND gate ND5 for receiving output signals of the seventh and eighth inverters I7 and I8 and the first NOR gate NR1; a ninth inverter I9 for outputting a third control signal by inverting an output signal of the fifth NAND gate ND5; and a third transfer gate TG3 for transferring the data loaded on the global line GIO_U7<0> when the third control signal is activated.

The fourth data select unit 68 includes the first NOR gate NR1 commonly included in the first data select unit 62 for receiving the 16-bit bandwidth signal X16 and the read address information signal GAX13; the fifth inverter I5 commonly included in the second data select unit 64 for inverting the output signal of the first NOR gate NR1; the first inverter I1 commonly included in the first data select unit 62 for inverting the read address information signal GAY11; the eighth inverter I8 commonly included in the third data select unit 66 for inverting the output signal of the first inverter I1; the second NOR gate NR2 commonly included in the first data select unit 62 for receiving the write/read signal WTRDB and the output enable signal PINMUXB; the fourth NAND gate ND4 commonly included in the third data select unit 66 for receiving the 4-bit bandwidth signal X4 and the output of the second NOR gate NR2; the seventh inverter I7 commonly included in the third data select unit 66 for inverting the output signal of the fourth NAND gate ND4; a sixth NAND gate ND6 for receiving the output signals of the fifth, seventh and eighth inverters I5, I7 and I8; a tenth inverter I10 for outputting a fourth control signal by inverting an output signal of the sixth NAND gate ND6; and a fourth transfer gate TG4 for transferring the data loaded on the global line GIO_L7<0> when the fourth control signal is activated.

Next, the operation of the DOUT select unit 60 will be described according to the X16, X8 and X4 data widths.

First, the data select unit is activated when the output enable signal PINMUXB and write/read signal WTRDB have a logic low level, in each case. Under the above circumstance, the 16-bit bandwidth signal X16 becomes a logic high level in the X16 data width. Accordingly, the second data select unit 64 is activated in the X16 data width when the read address information signals GAX13 and GAY11 have a logic low level. That is, the second control signal is activated to a logic high level and the second transfer gate TG2 outputs the data loaded on the global line GIO_L0<0> in response to the activation of the second control signal.

Since the first, third and fourth data select units 62, 66 and 68 inactivate the corresponding control signal to a logic low level in response to the bandwidth signals X16 and X4 and the read address information signal GAY11, the first, third and fourth transfer gates TG1, TG3 and TG4 are not activated. Therefore, the data loaded on the global line GIO_L0<0> are outputted as the read data RD_DQ<0> by the second data select unit 64 at the read operation with the X16 data width.

Moreover, in the X8 data width, the 16-bit bandwidth signal X16 becomes a logic low level the same as the 4-bit bandwidth signal X4. On these conditions, the first data select unit 62 is activated when the read address information signals GAX13 and GAY11 have a logic low level. That is, the first control signal is activated to a logic high level and the first transfer gate TG1 outputs the data loaded on the global line GIO_U0<0> in response to the activation of the first control signal.

However, the second data select unit 64 is activated when the read address information signals GAX13 and GAY11 have logic high and low levels, respectively. That is, the second transfer gate TG2 outputs the data loaded on the global line GIO_L0<0> in response to the activation of the second control signal.

Since the third and fourth data select units 66 and 68 inactivate the corresponding control signal to a logic low level in response to the bandwidth signals X16 and X4 and the read address information signal GAY11, the third and fourth transfer gates TG3 and TG4 are not activated. Therefore, at the read operation with the X8 data width, the first and second data select units 62 and 64 output the data loaded on the global line GIO_U0<0> or GIO_L0<0> as the read data RD_DQ<0> in response to the logic level of the read address information signal GAX13.

Further, in the data width of X4, the first to fourth data select units 62, 64, 66 and 68 activate the first to fourth control signals to a logic high level in response to the logic levels of the read address information signals GAX13 and GAY11. Subsequently, the first to fourth transfer gates TG1, TG2, TG3 and TG4 select one of the data which are loaded on the global lines GIO_U0<0>, GIO_L0<0>, GIO_U7<0> and GIO_L7<0> in response to the activation of the corresponding control signal and outputs the selected data as the read data RD_DQ<0>.

TABLE 1

| Mode | X16 data width (X16 = H, X4 = L) | X8 data width (X16 = L, X4 = L) | X4 data width (X16 = L, X4 = H) |
| --- | --- | --- | --- |
| Transfer gate TG1 | Inactivation | GAX13 = L GAY11 = L | GAX13 = L GAY11 = L |
| Transfer gate TG2 | GAX13 = L GAY11 = L | GAX13 = H GAY11 = L | GAX13 = H GAY11 = L |
| Transfer gate TG3 | Inactivation | Inactivation | GAX13 = L GAY11 = H |
| Transfer gate TG4 | Inactivation | Inactivation | GAX13 = H GAY11 = L |

Therefore, as shown in Table <1>, the DOUT select unit 60 according to the conventional semiconductor memory device makes only the global line GIO_L0<0> coupled to the DQ pad LDQ0 in the X16 data width. In case of the X8 data width, one of the data loaded on the global lines GIO_L0<0> and GIO_U0<0> is selected in response to read address information signal GAX13. In case of the data width of X4, one of the data loaded on the global lines GIO_L0<0>, GIO_U0<0>, GIO_L7<0> and GIO_U7<0> is selected in response to read address information signals GAX13 and GAY11.

Meanwhile, the operation of the conventional semiconductor memory device as shown in FIGS. 1 to 3 will be described below.

First, the write operation at which the data mask signal DM and the data DQ are inputted from an external circuit will be described.

The DM pad 10 receives the data mask signal DM. The DM buffer unit 22 converts the output signals of the DM pad 10 to the internal voltage level and outputs the converted signals as the internal mask signals INT_DM. The DM alignment unit 24 outputs the alignment mask signals ALGN_DM<0:3> by aligning the internal mask signals INT_DM. Next, the DM sense amplifier 25 senses and amplifies the alignment mask signals ALGN_DM<0:3> to outputs them as the mask control signals DM_CTRL<0:3>.

Moreover, the data DQ are applied to the DQ pad 30 from the external circuit. The DQ buffer unit 42 converts the output signals of the DQ pad 30 into the internal voltage level and then outputs the converted signals as the internal data INT_DQL0. The DQ alignment unit 44 outputs the alignment data ALGN_DQ<0:3> by aligning output signals of the DQ buffer unit 42. The DIN select unit 50 selectively outputs the plurality of the alignment data ALGN_DQL0<0:3>, ALGN_DQU0<0:3>, ALGN_DQL7<0:3> and ALGN_DQU7<0:3> by decoding the write address information signals ADD_WT<13> and ADD_WT<11>.

The DIN sense amplifier 55 senses and amplifies the output data of the DIN select unit 50 and then applies the amplified data to the corresponding global lines GIO_L0<0:3>. The write driving units 82 selectively apply the data loaded on the corresponding global lines GIO_L0<0:3> to the data lines LIO in response to the mask control signals DM_CTRL<0:3>. For example, the write driving units 82 do not transfer the data on the global lines GIO_L0<0:3> to the corresponding data lines LIO when the corresponding mask control signals DM_CTRL<0:3> are activated, but transfer the data to the corresponding data line LIO when the corresponding mask control signals DM_CTRL<0:3> are inactivated. That is, the mask control signal DM controls the driving of the write driving units 82 along the same route that the data takes at the write operation. However, since the mask control signal DM is not applied at the read operation, the practical operation does not exist.

On the other hand, the read operation, at which the data are outputted via the DQ pad in response to the corresponding read command, will be described below.

The read driving units 84 sense and amplify the data loaded on the corresponding data lines LIO and then outputs the amplified data to the global lines GIO_L0<0:3>. The DOUT select unit 60 selectively outputs the data loaded on the plurality of the global lines GIO_L0<0:3>, GIO_U0<0:3>, GIO_L7<0:3> and GIO_U7<0:3> in response to the bandwidth signals (X16 and X4), the write/read signal WTRDB and the output enable signal PINMUXB. That is, as shown in FIGS. 2A to 2C, each of the global lines is coupled to the corresponding DQ pad by the DOUT select unit in case of the X16 data width. In case of the X8 data width, two global lines are coupled to the DQ pad and the commonly coupled global lines are selected by the address signal. In case of the X4 data width, four global lines are coupled to the DQ pad and the commonly coupled global lines are also selected by the address signal. The pipe latch unit 74 aligns the plurality of the output signals RD_DQ<0:3> from the DOUT select unit 60 to the serial data SR_DQ and then outputs the aligned data. The driving unit 72 drives the serial data SR_DQ to the DQ pad 30.

In case that the conventional semiconductor memory device is tested by an external test equipment, the number of semiconductor memory devices which can be tested at a time is restricted because the number of pins of the test equipment is restricted. Furthermore, since the initial set-up time to test the semiconductor memory device is longer than the actual test time of the semiconductor memory device, it is necessary to test a large number of the semiconductor memory devices at a time in order to reduce the total test time. For example, it is assumed that two semiconductor memory devices having the X16 data width can be tested by the test equipment which has the restricted number of the pins, the test of four semiconductor memory devices can be carried out at a time in such a manner that the semiconductor memory devices is driven in the X8 data width, in order to reduce the test time by increasing the number of the semiconductor memory devices to be tested at a time. However, even if the number of the semiconductor memory devices which are tested at a time is increased, the reliability of the test is decreased because the test of the semiconductor memory devices is carries out in the X8 data width, but not in the X16 data width of the actual driving condition.

SUMMARY OF THE INVENTION

Embodiments of the present invention are directed to providing a semiconductor memory device capable of reducing a test time upon the same condition of the actual operation thereof.

In one embodiment, a semiconductor memory device includes an output data select unit for selectively outputting valid data, which are loaded on a plurality of global lines, in response to an output control signal activated after a delay time corresponding to an additive latency from entry of a read operation in a test mode, and a data output unit for aligning data outputted from the output data select unit and for outputting the aligned data through data pads.

In another embodiment, a method for driving a semiconductor memory device includes applying valid data to sixteen global lines by performing a read operation based on a read common in a test mode, outputting a half of the data loaded on the sixteen global lines in response to a first logic level of an output control signal, applying the valid data to the sixteen global lines by performing the read operation based on the read common in the test mode, and outputting another half of the data loaded on the sixteen global lines in response to a second logic level of the output control signal.

BRIEF DESCRIPTION OF THE DRAWINGS

FIG. 7 is a waveform illustrating an operation of the semiconductor memory device of FIG. 4 in the test mode.

DESCRIPTION OF SPECIFIC EMBODIMENTS

Hereinafter, a semiconductor memory device in accordance with the present invention will be described in detail referring to the accompanying drawings.

Figure 1:
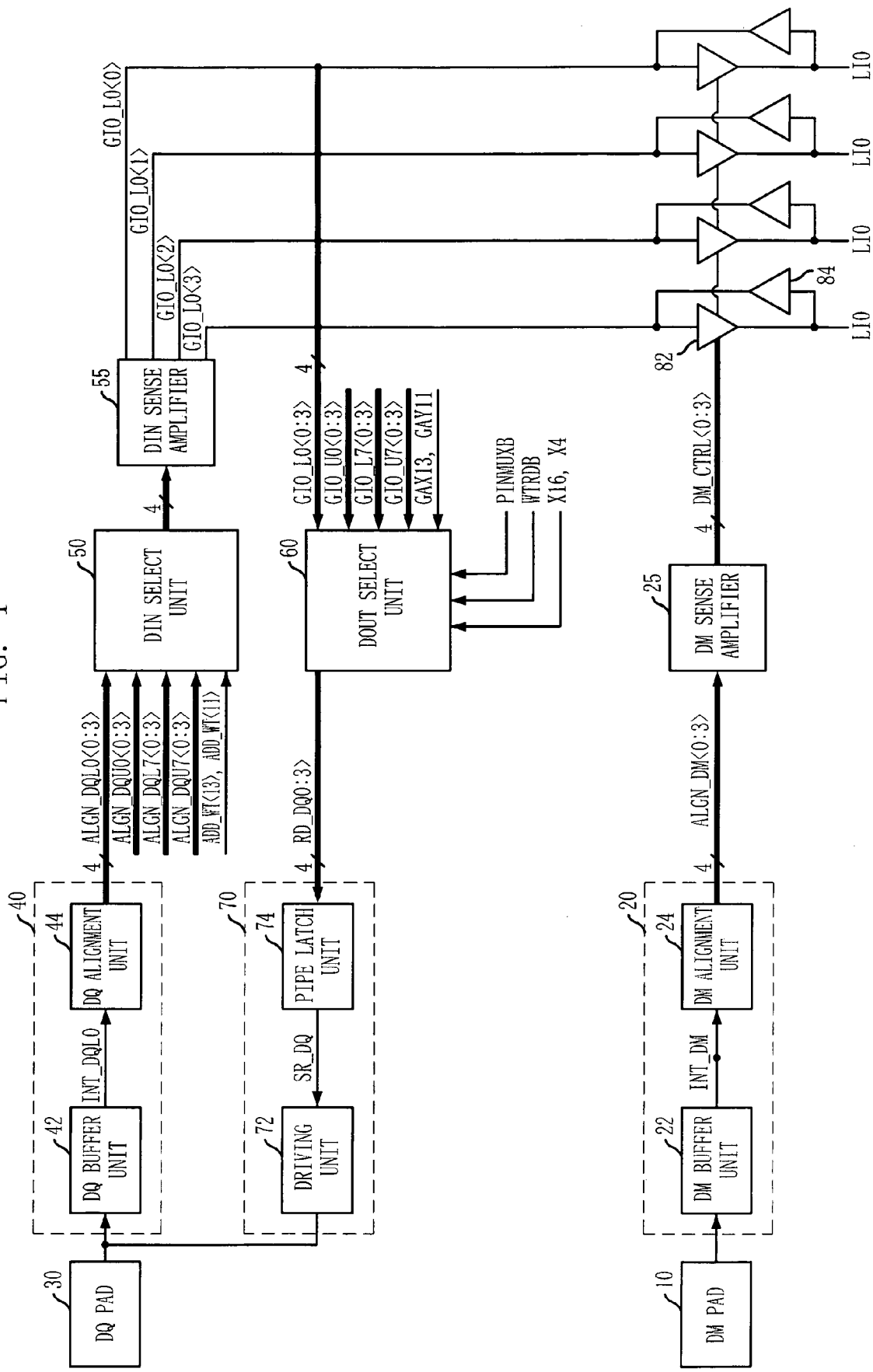
FIG. 1 illustrates a block diagram of a conventional semiconductor memory device including an I/O unit.
Figure 2A:
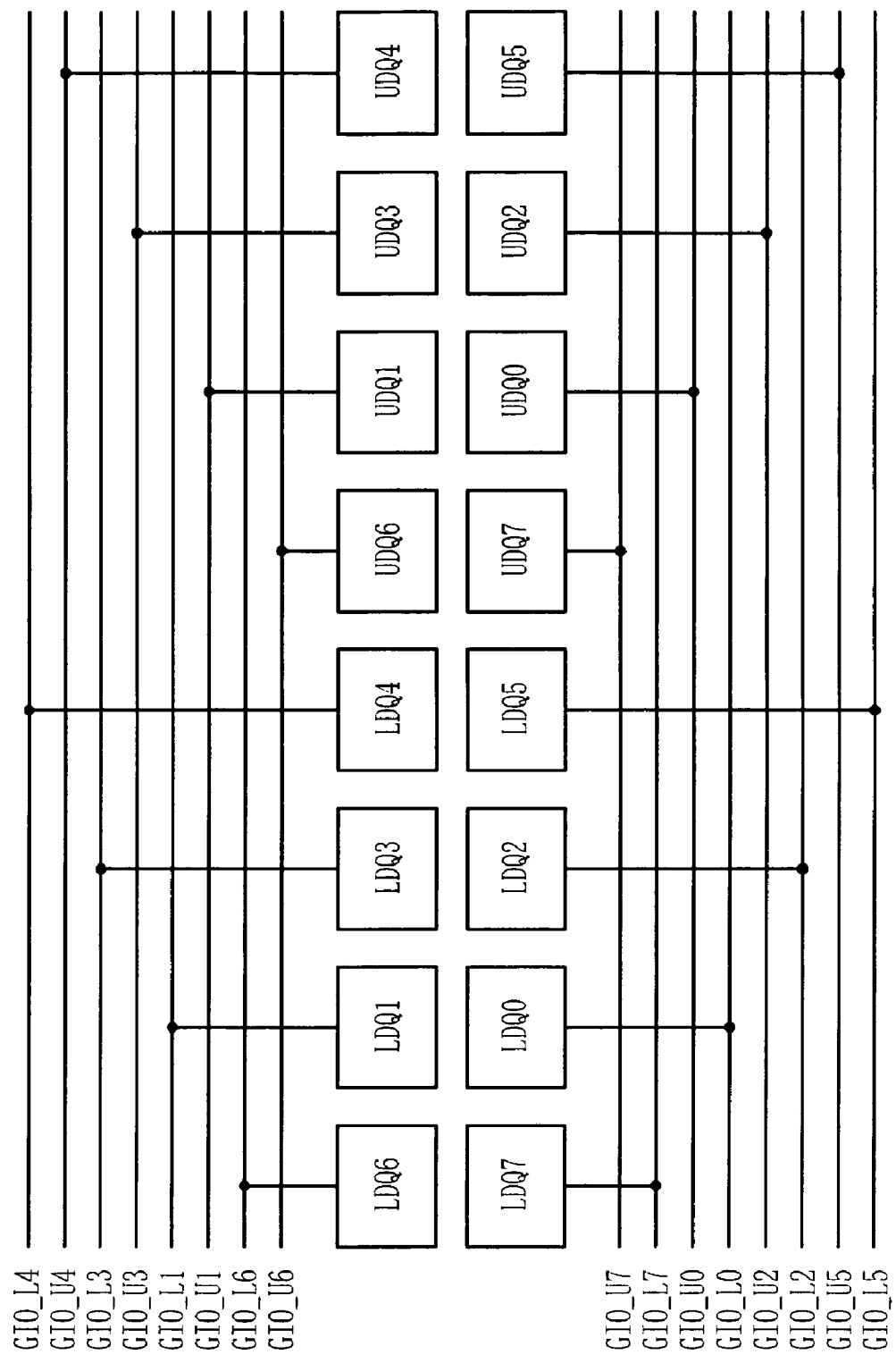
FIG. 2A illustrates a schematic circuit diagram of an interconnection between data pads and global lines in the case of the X16 data width.
Figure 2B:
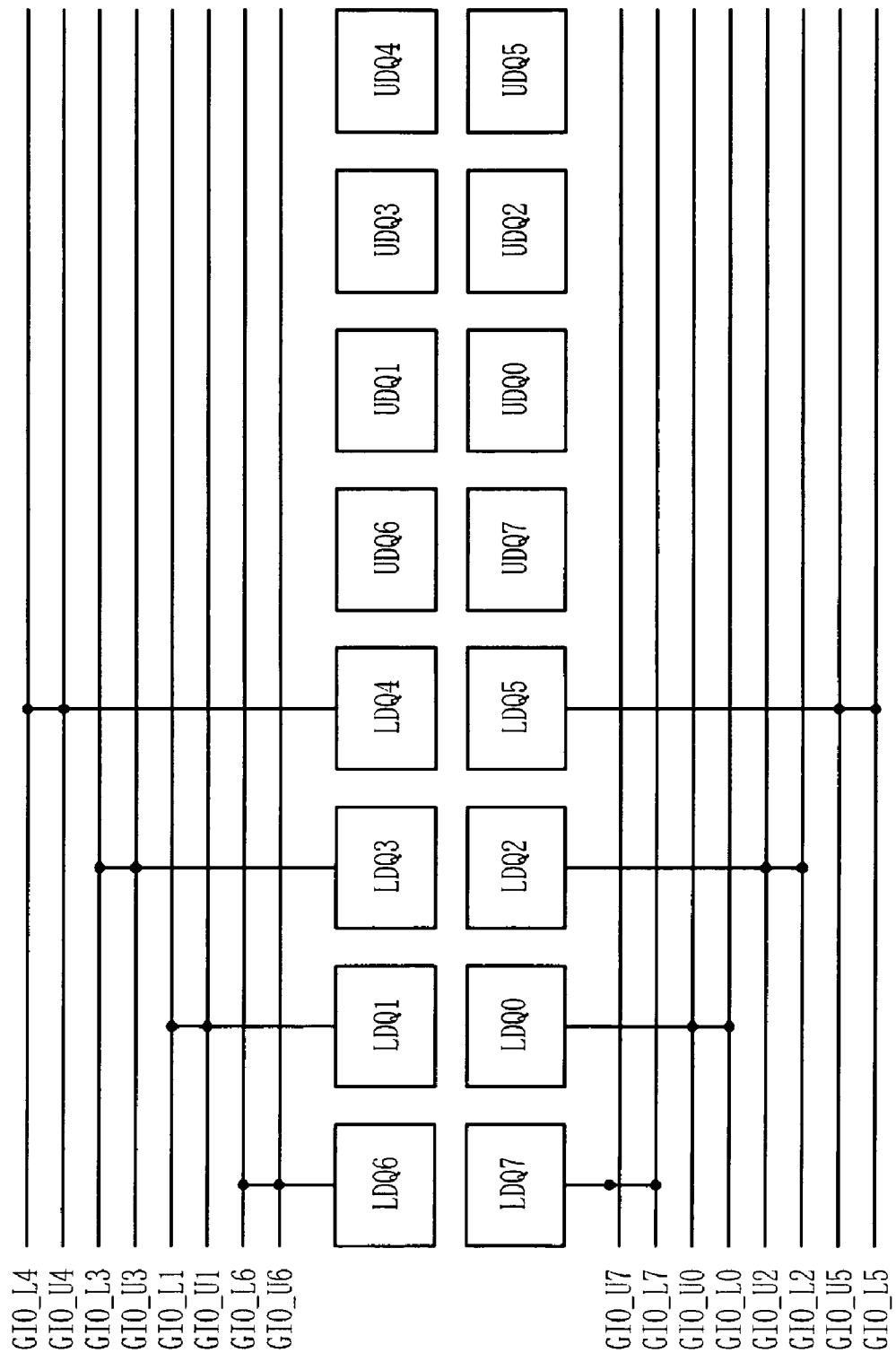
FIG. 2B illustrates a schematic circuit diagram of an interconnection between the data pads and the global lines in the case of the X8 data width.
Figure 2C:
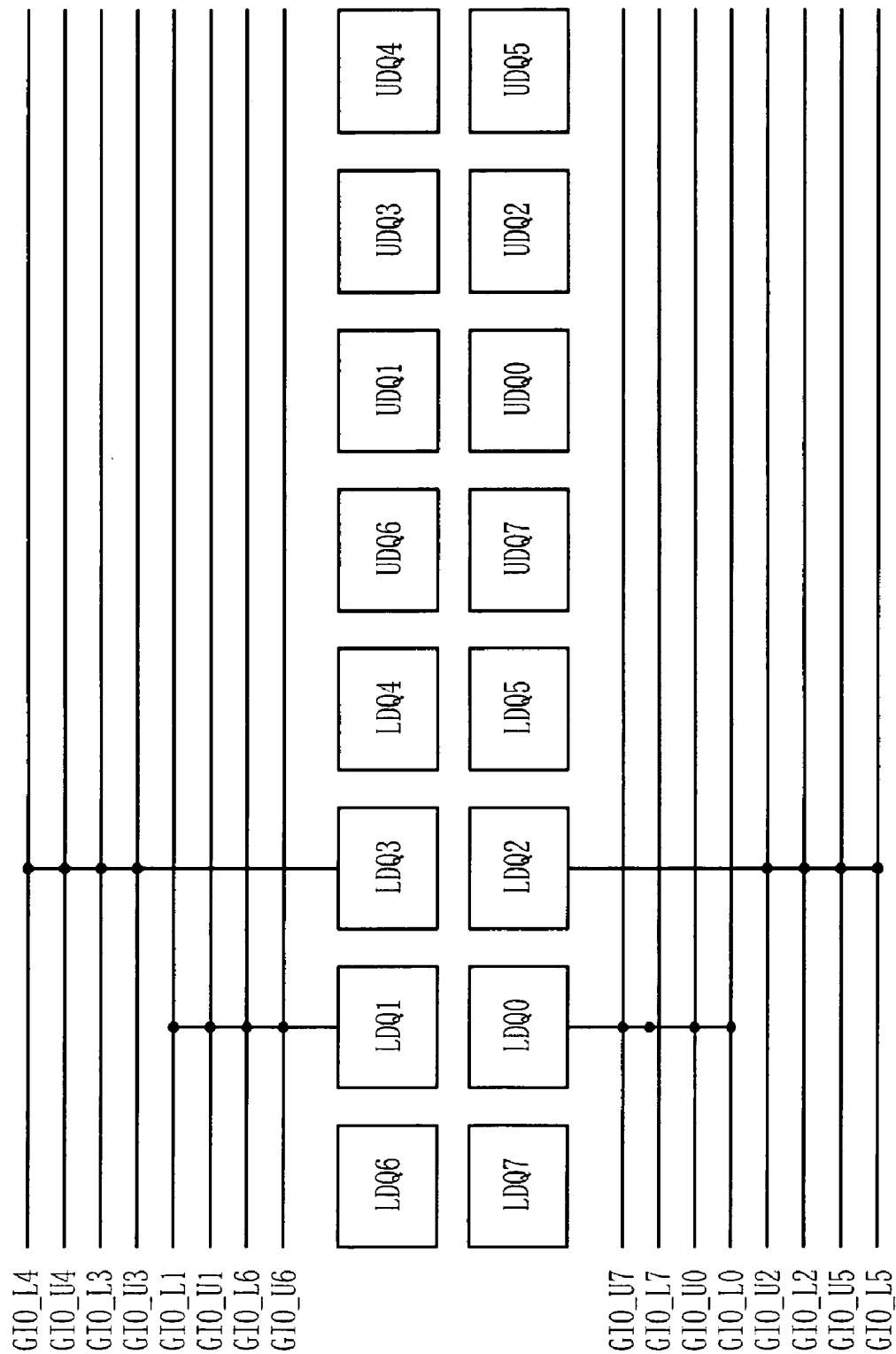
FIG. 2C illustrates a schematic circuit diagram of an interconnection between the data pads and the global lines in the case of the X4 data width.
Figure 3:
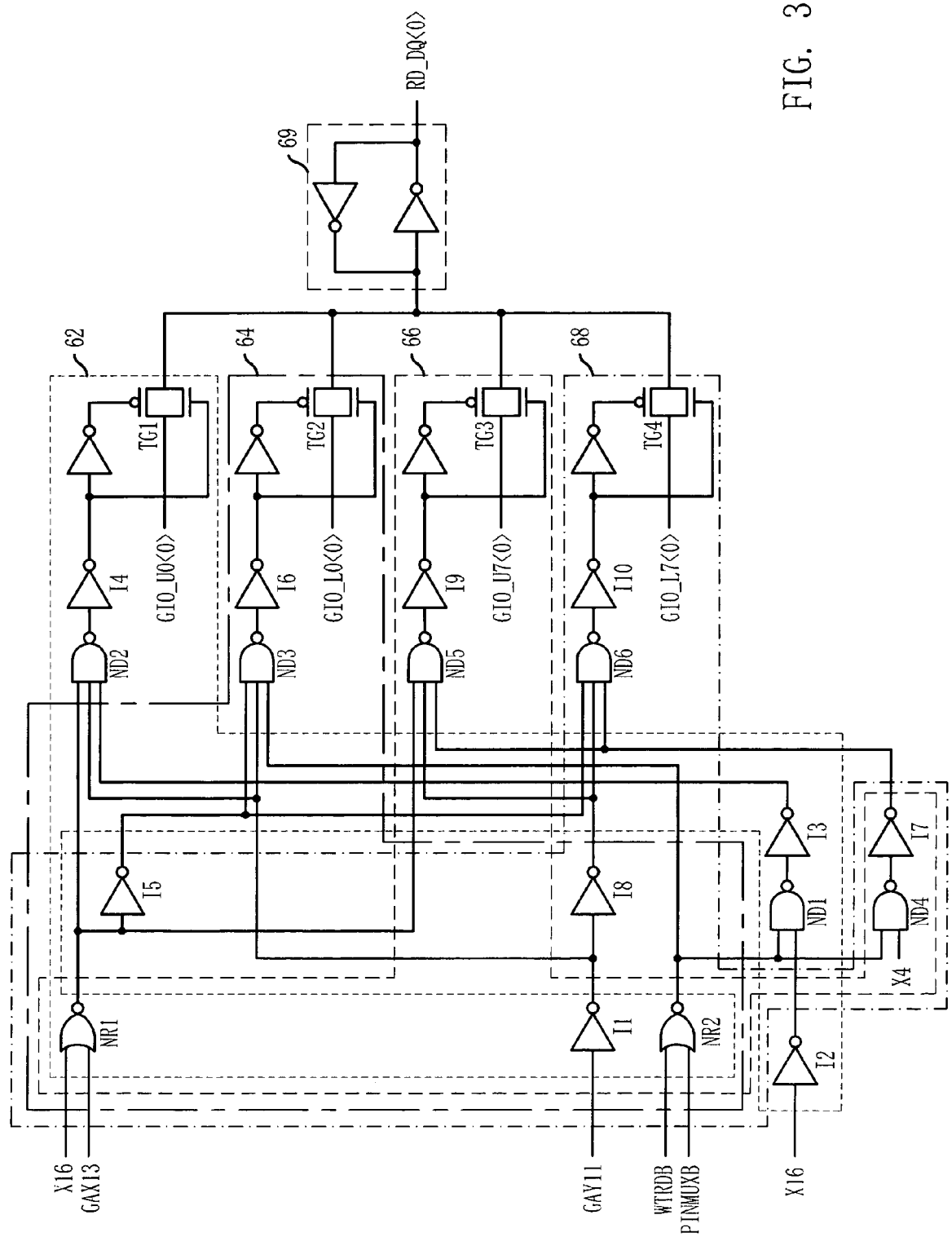
FIG. 3 illustrates a schematic circuit diagram of the DOUT select unit described in FIG. 1.
Figure 4:
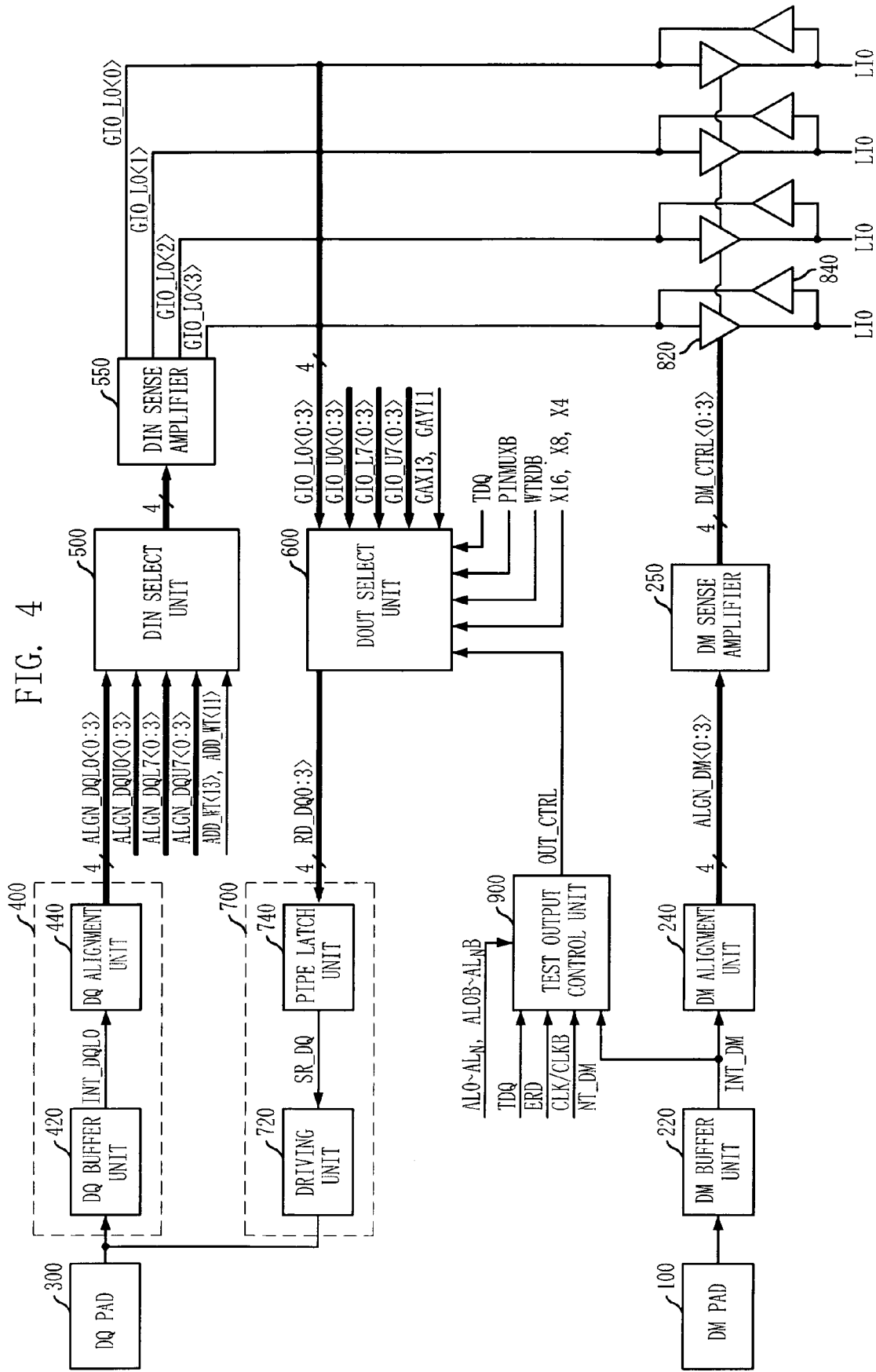
FIG. 4 illustrates a block diagram of a semiconductor memory device including an I/O unit according to one embodiment of the present invention.

FIG. 4 illustrates a block diagram of a semiconductor memory device including an I/O unit according to one embodiment of the present invention. The I/O unit of the semiconductor memory device according to one embodiment of the present invention includes a DM pad 100 for receiving a data mask signal DM; a DM buffer unit 220 for converting output signals from the DM pad 10 into internal voltage signals in order to produce internal mask signals INT_DM; a test output control unit 900 for outputting an output control signal OUT_CTRL by delaying the internal mask signals INT_DM for a time which is correspondent to an additive latency in a test mode; a plurality of read driving units 840 for sensing and amplifying data loaded on corresponding data lines LIO and applying the amplified data to corresponding global lines GIO_L0<0:3>; a DOUT select unit 600 for selectively receiving plural valid data of data loaded on the global lines GIO_L0<0:3>, GIO_U0<0:3>, GIO_L7<0:3> and GIO_U7<0:3> in response to the output control signal OUT_CTRL at a read operation in a test mode; and a data output unit 700 for aligning output signals RD_DQ<0:3> of the DOUT select unit 600 and outputting them to a DQ pad 300. The DQ pad 300 is also used for inputting and outputting the data DQ.

The data output unit 700 includes a pipe latch unit 740 for aligning the output signals RD_DQ<0:3> of the DOUT select unit 600 to a serial data SR_DQ and a driving unit 720 for applying the serial data SR_DQ to the DQ pad 300.

The DOUT select unit 600 selectively receives the valid data loaded on the plurality of the global lines GIO_L0<0:3>, GIO_U0<0:3>, GIO_L7<0:3> and GIO_U7<0:3> in response to bandwidth signals (X16, X8 and X4), a read/write signal WTRDB, an output enable signal PINMUXB and read address information signals GAX13 and GAY11 in a normal data width and also selectively receives the valid data loaded on the plurality of the global lines GIO_L0<0:3>, GIO_U0<0:3>, GIO_L7<0:3> and GIO_U7<0:3> in response to a test signal TDQ, the output control signal OUT_CTRL, the bandwidth signals (X16, X8 and X4), the read/write signal WTRDB, the output enable signal PINMUXB and the read address information signals GAX13 and GAY11 in a test mode.

Further, the semiconductor memory device according to the present invention, at the write path, further includes a DM alignment unit 240 for aligning the internal mask signals INT_DM in order to output them as the alignment mask signals ALGN_DM<0:3>; a DM sense amplifier 250 for sensing and amplifying the alignment mask signals ALGN_DM<0:3> and outputting the amplified signals as mask control signals DM_CTRL<0:3>; a data input unit 400 for converting output signals of the DQ pad 300 into internal voltage signals and aligning them in order to output alignment data ALGN_DQ<0:3>; a DIN select unit 500 for selecting one from the plurality of the alignment data ALGN_DQL0<0:3>, ALGN_DQU0<0:3>, ALGN_DQL7<0:3> and ALGN_DQU7<0:3> in response to the write address information signals ADD_WT<13> and ADD_WT<11>; a DIN sense amplifier 550 for sensing and amplifying the selected data from the DIN select unit 500 and applying the amplified signal to the global lines GIO_L0<0:3>; and a plurality of write driving units 820 for selectively applying the data, which are loaded on the corresponding global lines GIO_L0<0:3>, to corresponding data lines LIO in response to the mask control signal DM_CTRL<0:3>.

The data input unit 400 includes a DQ buffer unit 420 for converting the output signals from the DQ pad 300 into internal voltage signals in order to produce internal data signals INT_DQL0 and a DQ alignment unit 440 for aligning output signals from the DQ buffer unit 420 in order to output them as alignment data ALGN_DQ<0:3>.

As mentioned above, the semiconductor memory device according to the present invention performs, during the test mode, the masking operation of a part of valid data loaded on the global lines by further including the test output control unit 900 which outputs the output control signal OUT_CTRL by delaying the signals applied from the DM pad 100 for a time which is correspondent to an additive latency. For example, even though the valid data are actually outputted through the sixteen global lines in the X16 data width during the test mode, some of the valid data are masked by the output control signal OUT_CTRL such that the eight global lines make a contribution to the valid data output. The masked data of the valid data, which are loaded on the global lines, are outputted at the next test mode.

Figure 5:
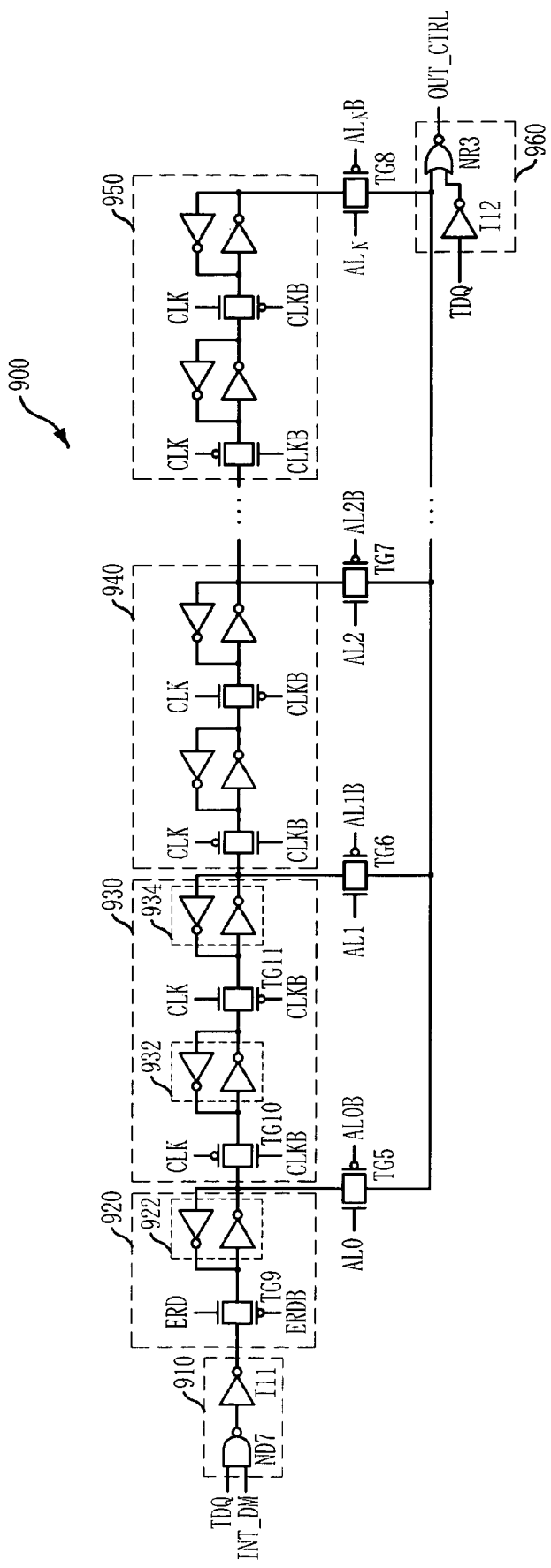
FIG. 5 illustrates a schematic circuit diagram of a test output control unit described in FIG. 4.

The configuration of the test output control unit 900 of FIG. 4 will be described referring to FIG. 5. FIG. 5 illustrates a schematic circuit diagram of the test output control unit described in FIG. 4. The test output control unit 900 includes an input unit 910 for receiving the test signal TDQ and the internal mask signal INT_DM; a first latch unit 920 for inverting and latching an output signal of the input unit 910 in synchronization with the read flag signals ERD and ERDB in order to output a first transfer signal; a second latch unit 930 for outputting a second transfer signal by delaying the first transfer signal by one clock period based on an internal clock CLK; a third latch unit 940 for outputting a third transfer signal by delaying the second transfer signal by one clock period based on the internal clock CLK; a N-th latch unit 950 for outputting an N-th transfer signal by delaying an N-1-th transfer signal by one clock period based on the internal clock CLK; a plurality of transfer gates TG5, TG6, TG7 and TG8 for transferring the first to N-th transfer signals in response to the corresponding additive latency information signals AL0 to AL$_N$ and AL0B to AL$_N$B, respectively; and an output unit 960 for outputting the signal passing through the plurality of transfer gates TG5, TG6, TG7 and TG8 as the output control signal OUT_CTRL in response to the test signal TDQ.

The input unit 910 includes a NAND gate ND7 for receiving the test signal TDQ and the internal mask signal INT_DM and an inverter I11 for inverting an output signal of the NAND gate ND7. The output unit 960 includes an inverter I12 for inverting the test signal TDQ and a NOR gate NR3 for receiving a common node signal, which is applied from the plurality of the transfer gates TG5, TG6, TG7 and TG8, and an output signal of the inverter I12 in order to output the output control signal OUT_CTRL. The first latch unit 920 includes a transfer gate TG9 and a latch element 922 which outputs the first transfer signal by inverting and latching an output signal of the transfer gate TG9. The transfer gate TG9 transfers an output signal of the input unit 910 while the read flag signal ERD is in a logic high level while the inverted read flag signal ERDB is in a logic low level.

Since all of the second to N latch units 930, 940 and 950 have the same circuit blocks, only the second latch unit 930 is described in detail below. The second latch unit 930 includes a first transfer gate TG10 for transferring the first transfer signal in response to a low level of the internal clock CLK, a first latch element 932 for inverting and latching an output signal of the transfer gate TG10, a second transfer gate TG11 for transferring an output signal of the first latch element 932 in response to a high level of the internal clock CLK, and a second latch element 934 for outputting the second transfer signal by inverting and latching an output signal of the second transfer gate TG11. Here, the latch elements 922, 932 and 934 are cross-coupled inverters. Further, the read flag signal ERD is a pulse signal which is produced by the read command.

Subsequently, the operation of the test output control unit 900 will be described in detail below. First, the input unit 910 receives and outputs the internal mask signal INT_DM during the activation of the test signal TDQ. Next, the first latch unit 920 outputs an output signal of the input unit 910 as the first transfer signal in response to the activation of the read flag signal ERD. The second to N latch units 920, 930, 940, 950, which are in series coupled to each other, outputs the second to N-th transfer signals by sequentially delaying output signals from the previous stages by one clock period based on the internal clocks CLK and CLKB.

Each of the plurality of the transfer gates TG5, TG6, TG7 and TG8 transfers the corresponding output signal in response to the activation of the corresponding signal among the plurality of the additive latency information signals AL0 to AL$_N$ and AL0 to AL$_N$B. The output unit 960 outputs, as the output control signal OUT_CTRL, the signal applied to the common output node of the plurality transfer gate TG5, TG6, TG7, TG8 while the test signal TDQ has a high logic level.

As described above, the test output control unit 900 outputs the output control signal OUT_CTRL by counting a delay time of the applied internal mask signal INT_DM, which is correspondent to the additive latency from the start of activation of the reading flag signal ERD based on the internal clock signals CLK and CLKB, while the test signal TDQ is activated. That is, the output control signal OUT_CTRL is activated at the time of executing the read operation based on the read command.

Figure 6:
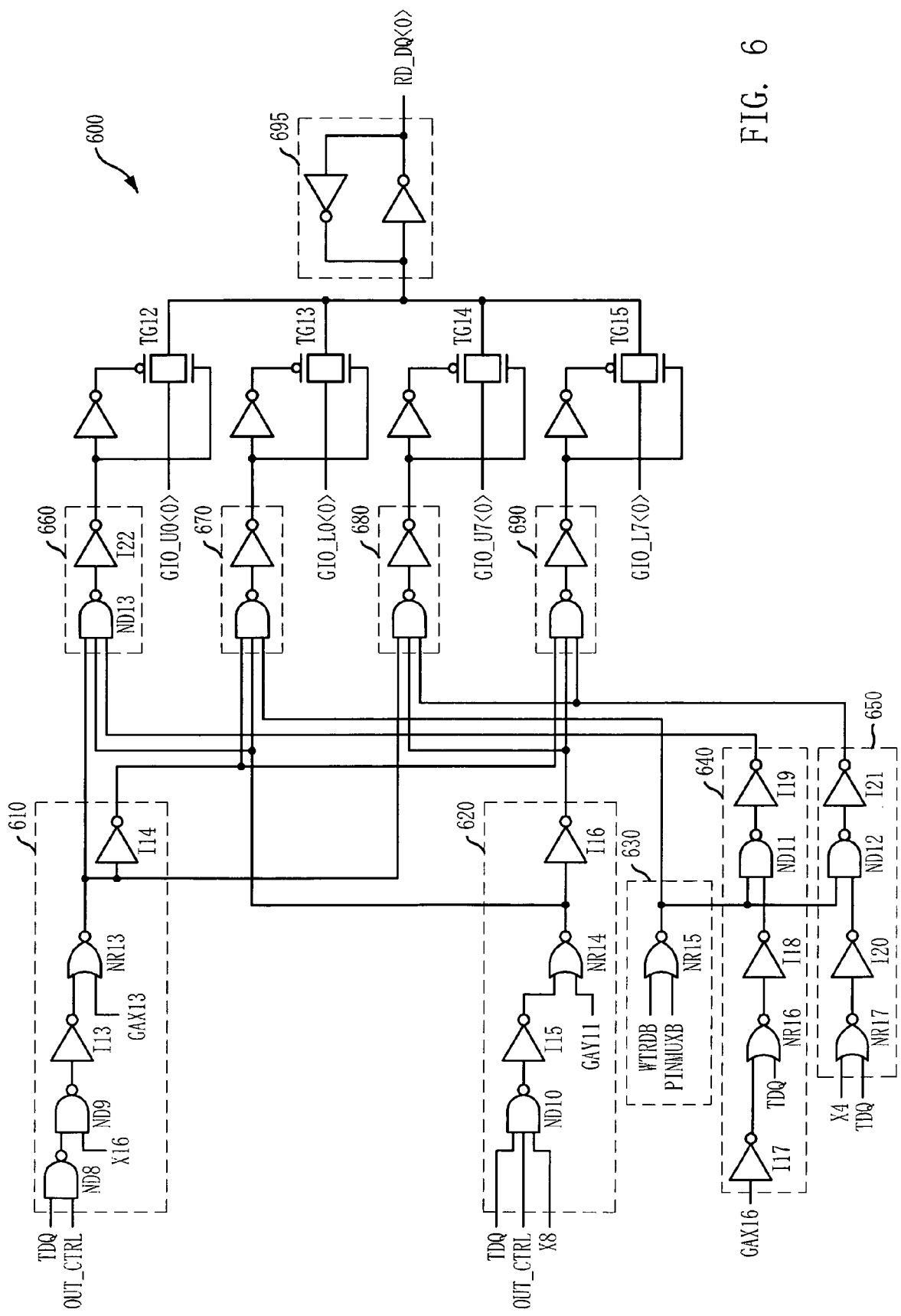
FIG. 6 illustrates a schematic circuit diagram of a DOUT select unit described in FIG. 4

FIG. 6 illustrates a schematic circuit diagram of the DOUT select unit 600 described in FIG. 4. The DOUT select unit 600 includes a first control unit 610 for outputting first positive/negative control signals to control a read operation in the X16 data width during the test mode or to control the read operation according to the read address information signal GAX13; a second control unit 620 for outputting second positive/negative control signals to control the read operation in the X8 data width during the test mode or to control the read operation according to the read address information signal GAY11; a third control unit 630 for outputting a third control signal activated at the read operation; a fourth control unit 640 for outputting a fourth control signal to control the read operation in the case of the test mode in which the third control signal is activated or in the case where the data width is not X16 bits with activation of the third control signal; a fifth control unit 650 for outputting a fifth control signal to control the read operation in the case of the test mode in which the third control signal is activated or in the case where the data width is X4 with the activation of the third control signal; a first signal generating unit 660 to receive the first and second positive control signals and the fourth control signal and then produce a first output signal; a second signal generating unit 670 to receive the first negative signal, the second positive control signal and the third positive control and then produce a second output signal; a third signal generating unit 680 to receive the first positive signal, a second negative signal and the fifth control signal and then produce a third output signal; a fourth signal generating unit 690 to receive the first and second negative signals and the fifth control signal and then produce a fourth output signal; a first transfer gate TG12 to transfer the data loaded on the global line GIO_U0<0> in response to the first output signal; a second transfer gate TG13 to transfer the data loaded on the global line GIO_L0<0> in response to the second output signal; a third transfer gate TG14 to transfer the data loaded on the global line GIO_U7<0> in response to the third output signal; a fourth transfer gate TG15 to transfer the data loaded on the global line GIO_U7<0> in response to the fourth output signal; and a latch unit 695 to invert and latch the signal which is applied to a common node of the first to fourth transfer gates TG12, 13, 14 and 15.

The first control unit 610 includes a NAND gate ND8 to receive the test signal TDQ and the output control signal OUT_CTRL as two input signals; a NAND gate ND9 to receive an output signal of the NAND gate ND8 and the bandwidth signal of X16 as two input signals; an inverter I13 to invert an output signal of the NAND gate ND9; a NOR gate NR13 to receive an output signal of the inverter I13 and the read address information signal GAX13 in order to output the first positive control signal; and an inverter I14 to invert an output signal of the NOR gate NR13 and then produce the first negative control signal.

The second control unit 620 includes a NAND gate ND10 to receive the test signal TDQ, the output control signal OUT_CTRL and the bandwidth signal of X8; an inverter I15 to invert an output signal of the NAND gate ND10; a NOR gate NR14 to receive an output signal of the inverter I15 and the read address information signal GAY11 in order to output the second positive control signal; and an inverter I16 to invert an output signal of the NOR gate NR14 and then produce the second negative control signal. The third control unit 630 include a NOR gate NR15 to receive the write/read signal WTRDB and the output enable signal PINMUXB in order to output the third control signal.

The fourth control unit 640 includes an inverter I17 to invert the bandwidth signal of X16; a NOR gate ND16 to receive an output signal of the inverter I17 and the test signal TDQ; an inverter I18 to invert an output signal of the NOR gate ND16; a NAND gate ND11 to receive an output signal of the inverter I18 and the third control signal; and an inverter I19 to invert an output signal of NAND gate ND11 in order to produce the fourth control signal.

The fifth control unit 650 includes a NOR gate ND17 to receive the bandwidth signal of X4 and the test signal TDQ; an inverter I20 to invert an output signal of the NOR gate ND17; a NAND gate ND12 to receive an output signal of the inverter I20 and the third control signal; and an inverter I21 to invert an output signal of NAND gate ND12 in order to produce the fifth control signal.

The first to fourth signal generating units 660, 670, 680 and 690 has the same circuit implementation of the logic multiplication, except for their input signals. Therefore, one of the first to fourth signal generating units 660, 670, 680 and 690 will be described in detail. The first signal generating unit 660 includes a NAND gate ND13 to receive the first and second positive control signal and the fourth control signal and an inverter I22 to invert an output of the NAND gate ND13 in order to output the first output signal.

The operation of the DOUT select unit 600 will be described in detail below. The DOUT select unit 600 according to the present invention performs an operation the same as that illustrated in table 1 in the normal data width in which the test signal TDQ is not activated in a low. Therefore, the detailed description of this operation will be omitted.

On the other hand, the operation of the DOUT select unit 600 during the test mode, in which the test signal TDQ is activated in a logic high level, will be described in detail.

First, the case that the bandwidth signal X16 is activated in a logic high level, that is, the X16 data width, will be described in detail.

It is assumed that the writ/read signal WTRDB and the output enable signal PINMUXB have a logic low level and all the read address information signals GAY11 and GAX13 are inactivated in a logic low level. Also, it is assumed that the bandwidth signal X16 is activated in a logic high level, the bandwidth signal X8 and X4 are inactivated in a logic low level, and the output control signal OUT_CTRL has a logic high level.

The first control unit 610 outputs the first positive control signal, in response to the test signal TDQ, the output control signal OUT_CTRL and the bandwidth signal X16, to a logic high level and outputs the first negative control signal to a logic low level. The second control unit 620 outputs the second positive control signal to a logic high level and outputs the second negative control signal to a logic low level in response to the inactivation of the bandwidth signal X8 and the read address information signal GAY11. The third control unit 630 receives the write/read signal WTRDB and the output enable signal PINMUXB and then activates the third control signal to a logic high level. The fourth control unit 640 activates the fourth control signal to a logic high level in response to the test signal TDQ and the third control signal. The fifth control unit 650 activates the fifth control signal to a logic high level in response to the test signal TDQ and the third control signal.

The first signal generating unit 660 activates the first output signal to a logic high level because both the first and the second positive control signals and the fourth control signal are in a logic high level. The second signal generating unit 670 inactivates the second output signal to a logic low level in response to a logic low level of the first negative control signal. The third and fourth signal generating units 680 and 690 respectively inactivate the corresponding third and fourth output signals to a logic low level in response to a logic low level of the second negative control signal.

Therefore, the first transfer gate TG12 transfers the data loaded on the global line GIO_U0<0> in response to a logic high level of the first output signal and these data are outputted as the read data RD_DQ<0> after the store and inversion operations by the latch unit 695. Since the second to fourth transfer gates TG13, TG14 and TG15 are not activated in response to the inactivation of the corresponding output signals, the data loaded on the corresponding global lines GIO_L0<0>, GIO_U7<0> and GIO_L7<0> are not transferred.

Meanwhile, assuming that the output control signal OUT_CTRL has a logic low level, the write/read signal WTRDB and the output enable signal PINMUXB are in a logic low level and all of the read address information signals GAY11 and GAX13 are inactivated to a logic low level. The bandwidth signal X16 is activated to a logic high level and the bandwidth signals X8 and X4 are inactivated to a logic low level. Since only the logic levels of the output control signals OUT_CTRL are different from each other and the logic levels of other signals are the same, a detailed description related with the same level will be omitted.

The first control unit 610 outputs the first positive control signal to a logic low level in response to the test signal TDQ, the output control signal OUT_CTRL and the bandwidth signal X16 and outputs the first negative control signal to a logic high level. The second control unit 620 outputs the second positive control signal to a logic high level and outputs the second negative control signal to a logic low level. The third to fifth control units 630, 640 and 650 activate the corresponding third to fifth control signals to a logic high level.

Further, since all of the first negative control signal, the second positive control signal and the third control signal have a logic high level, the second signal generating unit 670 activates the second output signal to a logic high level. Moreover, the first signal generating unit 660 inactivates the first output signal to a logic low level in response to the first positive control signal. The third and fourth signal generating units 680 and 690 respectively inactivate the third and fourth output signals to a logic low level in response to a logic low level of the second negative control signal.

Therefore, the second transfer gate TG13 transfers the data loaded on the global line GIO_L0<0> in response to a logic high level of the second output signal and these data are outputted as the read data RD_DQ<0> via the latch unit 695 to perform the store and inversion operations of the signal. Since the first, third and fourth transfer gates TG12, TG14 and TG15 are not activated in response to the inactivation of the corresponding output signals, the data loaded on the corresponding global lines GIO_U0<0>, GIO_U7<0> and GIO_L7<0> are not transferred.

In addition, the operation is described in detail when the bandwidth signal X8 is activated to a logic high level. In similar, assuming that the output control signal OUT_CTRL is in a logic low level, the write/read signal WTRDB and the output enable signal PINMUXB have a logic low level, the read address information signal GAY11 has a logic low level, and the read address information signal GAX13 has a logic high level. Also, the bandwidth signal X8 is activated to a logic high level and the bandwidth signals X16 and X4 are inactivated in a logic low level.

The first control unit 610 outputs the first positive control signal to a logic low level in response to the read address information signal GAX13 and outputs the first negative control signal to a logic high level. The second control unit 620 outputs the second positive control signal to a logic high level and outputs the second negative control signal to a logic low level. The third to fifth control units 630, 640 and 650 activate the corresponding third to fifth control signals to a logic high level, respectively.

The second signal generating unit 670 activates the second output signal to a logic high level because all of the first negative control signal, the second positive control signal and the third control signal have a logic high level. Moreover, the first signal generating unit 660 inactivates the first output signal to a logic low level in response to the first positive control signal. The third and fourth signal generating units 680 and 690 respectively inactivate the third output signal and the fourth output signal to a logic low level in response to a logic low level of the second negative control signal.

Therefore, the second transfer gate TG13 transfers the data loaded on the global line GIO_L0<0> in response to a logic high level of the second output signal. The transferred data are inverted and stored in the latch unit 695 and then outputted as the read data RD_DQ<0>. Since the first, third and fourth transfer gates TG12, TG14 and TG15 are not activated in response to the inactivation of the corresponding output signals, the data loaded on the corresponding global lines GIO_U0<0>, GIO_U7<0> and GIO_L7<0> are not transferred.

Moreover, it is assumed that the output control signal OUT_CTRL has a logic high level. Since other conditions are the same, the operation of this case will be described briefly.

The first control unit 610 outputs the first positive control signal to a logic low level in response to the read address information signal GAX13 and outputs the first negative control signal to a logic high level. The second control unit 620 outputs the second positive control signal to a logic low level and outputs the second negative control signal to a logic high level. The third to fifth control units 630, 640 and 650 activates the corresponding third to fifth control signals to a logic high level, respectively.

Since all of the first and the second negative control signals and the fifth control signal have a logic high level, the fourth signal generating unit 690 activates the fourth output signal to a logic high level. The first to third signal generating units 660, 670 and 680 inactivate the first to third output signals to a logic low level, respectively.

Therefore, the fourth transfer gate TG15 transfers the data loaded on the global line GIO_L7<0> in response to a logic high level of the fourth output signal. The transferred data are inverted and stored in the latch unit 695 and then outputted as the read data RD_DQ<0>. Since the first to third transfer gates TG12, TG13 and TG14 are not activated in response to the inactivation of the corresponding output signals, the data loaded on the corresponding global lines GIO_U0<0>, GIO_L0<0> and GIO_L7<0> are not transferred.

Table <2> below illustrates the operation of the DOUT select unit 600. As shown in Table <2>, the DOUT select unit 600 operates in the X16 data width during the test mode and the data loaded on the global line GIO_U0<0> or the GIO_L0<0> is selectively outputted according to the logic level of the output control signal OUT_CTRL. Moreover, while it operates in the X8 data width, the data loaded on the global line GIO_L0<0> or GIO_L7<0> is selectively outputted according to the logic level of the output control signal OUT_CTRL.

TABLE 2

| Mode | X16 data width<br>X16 = H<br>X8, X4, GAY11,<br>GAX13 = L | X8 data width<br>X8, GAX13 = H<br>X16, X4, GAY11 = L |
| --- | --- | --- |
| Transfer gate TG12 | OUT_CTRL = H | Inactivation |
| Transfer gate TG13 | OUT_CTRL = L | OUT_CTRL = L |
| Transfer gate TG14 | Inactivation | Inactivation |
| Transfer gate TG15 | Inactivation | OUT_CTRL = H |

Therefore, the DOUT select unit 600 according to the present invention selectively outputs the data loaded on the global line GIO_U0 and GIO_L0 as the read data base on the logic level of the output control signal OUT_CTRL during the test mode in the X16 data width.

FIG. 7 is a waveform illustrating an operation of the semiconductor memory device of FIG. 4 in the test mode. In the present invention, although the semiconductor memory device operates in the X16 data width in the test mode, eight DQ pads are actually employed to output the data. Therefore, the input of the read command is needed twice in order to output the data corresponding to the X16 data width. For example, the signal is first applied through the DM pad with the read command and only the read command is subsequently applied. With respect to this operation, the detailed driving will be described below.

First, at the test mode, if the signal from the outside is applied to the DM pad 100 with the read command RD, the reading flag signal ERD is activated. Next, the DM buffer unit 220 converts the output signals of the DM pad into the internal voltage level and then outputs the converted signals as the internal mask signals INT_DM. Thereafter, the test output control unit 900 activates the output control signal OUT_

CTRL by delaying the internal mask signal INT_DM by a time which corresponds to the additive latency. The point of time when the output control signal OUT_CTRL is activated is the same as the point of time when the actual read operation is carried out by the read command.

Moreover, the semiconductor memory device performs the read operation corresponding to the read command RD and then applies the valid data to the data line LIO. The plurality of the read driving units 840 sense and amplify the data loaded on the data line LIO and apply the amplified data to the corresponding global line GIO_L0<0:3>. At this time, since the semiconductor memory device operates in the X16 data width, the valid data are applied to all of the sixteen global lines GIO_L0 to GIO_L7 and GIO_U0 to GIO_U7.

Since the output control signal OUT_CTRL has a logic high level, the DOUT select unit 600 outputs the data loaded on the global lines GIO_U0 to GIO_U7 as the corresponding read data. The pipe latch unit 740 arranges the plurality of the parallel read data to serial read data and the driving unit 720 drives the DQ pad 300 to output the serial read data.

Continuously, when a read command is applied from the outside, the read flag signal ERD is activated again. The semiconductor memory device also performs the read operation corresponding to another read command RD without the signal applied to the DM pad 100, therefore applying the valid data to the data line LIO. The plurality of the read driving units 840 sense and amplify the data loaded on the data line LIO and apply the amplified data to the corresponding global line GIO_L0<0:3>. In similar, since the semiconductor memory device operates in the X16 data width, the valid data are applied to all of the sixteen global lines GIO_L0 to GIO_L7 and GIO_U0 to GIO_U7.

However, since the output control signal OUT_CTRL has a logic low level, the DOUT select unit 600 outputs the data loaded on the global lines GIO_L0 to GIO_L7 as the corresponding read data. The pipe latch unit 740 arranges the plurality of the parallel read data to serial read data and the driving unit 720 drives the DQ pad 300 to output the serial read data.

As described above, the semiconductor memory device according to the present invention operates in the X16 data width, however data on the eight upper global lines or the eight lower global lines are selectively outputted through the DQ pad under the control of the DOUT select unit 600 during the test mode.

As mentioned above, in the normal mode, the data are outputted through the corresponding global line and the DQ pad which are one-to-one mapped each other. However, in the test mode, the upper global lines GIO_U0 to GIO_U7 or the lower global lines GIO_L0 to GIO_L7 are selected by the signal, which is applied to the DM pad and the test output control unit 900, in order to output the data. After the entry of the test mode, the signal applied to the DM pad contributes to the section of the upper global lines GIO_U0 to GIO_U7 or the lower global lines GIO_L0 to GIO_L7.

Therefore, although the semiconductor memory device runs in the X16 data width in the test mode, the data are outputted only through the lower DQ pad LDQ0 to LDQ7. In other words, when the semiconductor memory device according to the present invention operates in the X16 data width after the entry of the test mode, it is possible to carry out the test using a half of the DQ pads. Being different from the conventional parallel test mode, the semiconductor memory device according to the present invention can reduce the number of the DQ pads to a half while the test mode is carried out in the X16 data width.

As mentioned above, for the semiconductor memory device to operate in the X16 data width, the test time taken in the present invention is longer than that in the conventional method. The reason why the present invention needs the test time twice as long as the conventional method in the X16 data width is that the test is carried out once. However, as described above, since the time to prepare the memory device test is much longer than the actual time required for testing the memory device, it is more effective, in view of the test time, that a lot number of memory devices are simultaneously tested.

As a result, the present invention can test twice as many semiconductor memory devices in the X16 data width as those in the conventional test method at once. Considering the time to prepare the test, the present invention can reduce the total test time. Moreover, since the test can be carried out in the X16 data width which is employed in the normal mode, the test can be highly improved. That is, since the circuit operates at the same manner as the normal mode, the present invention has an advantage that the normal operation of the memory device is actually tested without any other changes of the timing and internal voltage.

Meanwhile, in the above-described present invention, although the upper and lower global lines are selected by the signal which is applied to the DM pads during the test mode, it is possible to use a signal which is applied to a pad not to be used during the read operation. Moreover, such a control signal can be generated by delaying an internal signal corresponding to the read command or by using a signal which is activated based on the additive latency.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
    a test output control unit for outputting an output control signal by delaying an internal mask signal by a delay time corresponding to an additive latency from entry of a read operation in a test mode;
    an output data select unit for selectively outputting valid data, which are loaded on a plurality of global lines, in response to the output control signal during the read operation in the test mode; and
    a data output unit for aligning data outputted from the output data select unit and for outputting the aligned data to data pads.

2. The semiconductor memory device of claim 1, further comprising:
    a data mask pad for receiving a data mask signal; and
    a buffer unit for converting an output signal of the data mask pad into an internal voltage level in order to output the internal mask signal.

3. The semiconductor memory device of claim 1, wherein the plurality of global lines includes first to fourth global lines and wherein the output data select unit includes:
    a control signal generating unit for outputting first positive/negative control signals, second positive/negative control signals and third to fifth control signals in order to control a data output according to data widths to be outputted and modes including a normal mode and the test mode;
    an output signal generating unit for generating first to fourth output signals in response to the first positive/negative control signals, the second positive/negative control signals and the third to fifth control signals;

a transfer unit for transferring the data loaded on the corresponding global line in response to each of the first to fourth output signals; and a latch unit for outputting read data by inverting and latching an output signal of the transfer unit.

4. The semiconductor memory device of claim 3, wherein the control signal generating unit includes:
   a first control unit for outputting the first positive/negative control signals to control the read operation in a 16-bit data width during the test mode or to control the read operation according to a first read address information signal;
   a second control unit for outputting the second positive/negative control signals to control the read operation in a 8-bit data width during the test mode or to control the read operation according to a second read address information signal;
   a third control unit for outputting a third control signal activated at the read operation;
   a fourth control unit for outputting a fourth control signal to control the read operation if the test mode in which the third control signal is activated or if the data width is not 16 bits with activation of the third control signal; and
   a fifth control unit for outputting a fifth control signal to control the read operation if the test mode in which the third control signal is activated or if the data width is 4 bits with activation of the third control signal.

5. The semiconductor memory device of claim 4, wherein the output signal generating unit includes:
   a first signal generating unit for producing the first output signal in response to the first and second positive control signals and the fourth control signal;
   a second signal generating unit for producing the second output signal in response to the first negative control signal, the second positive control signal and the third control signal;
   a third signal generating unit for producing the third output signal in response to the first positive control signal, a second negative control signal and the fifth control signal; and
   a fourth signal generating unit for producing the fourth output signal in response to the first and second negative control signals and the fifth control signal.

6. The semiconductor memory device of claim 5, wherein the first control unit includes:
   a first NAND gate for performing a logic operation on a test signal to control an entry of the test mode and the output control signal;
   a second NAND gate for performing a logic operation on a first bandwidth signal to control the read operation of the 16-bit data width and an output signal of the first NAND gate;
   a first inverter to invert an output signal of the second NAND gate;
   a first NOR gate for performing a logic operation on an output signal of the first inverter and first read address information signal to output the first positive control signal; and
   a second inverter for inverting an output signal of the first NOR gate to output the first negative control signal.

7. The semiconductor memory device of claim 6, wherein the second control unit includes:
   a third NAND gate for performing a second bandwidth signal to control the read operation of the 8-bit data width, the test signal and the output control signal;
   a third inverter to invert an output signal of the third NAND gate;
   a second NOR gate for performing a logic operation on an output signal of the third inverter and the second read address information signal to output the second positive control signal; and
   a fourth inverter for inverting an output signal of the second NOR gate to output the second negative control signal.

8. The semiconductor memory device of claim 7, wherein the third control unit includes a third NOR gate for performing a logic operation on a read/write signal and an output enable signal to output the third control signal.

9. The semiconductor memory device of claim 8, wherein the fourth control unit includes:
   a fifth inverter for inverting the first bandwidth signal;
   a fourth NOR gate for performing a logic operation on an output signal of the fifth inverter and the test signal;
   a sixth inverter for inverting an output signal of the fourth NOR gate;
   a fourth NAND gate for performing a logic operation on an output signal of the sixth inverter and the third control signal; and
   a seventh inverter for inverting an output signal of the fourth NAND gate in order to output the fourth control signal.

10. The semiconductor memory device of claim 9, wherein the fifth control unit includes:
    a fifth NOR gate for performing a logic operation on a third bandwidth signal to control the read operation of the 4-bit data width and the test signal;
    an eighth inverter for inverting an output signal of the fifth NOR gate;
    a fifth NAND gate for performing a logic operation on an output signal of the eighth inverter and the third control signal; and
    a ninth inverter for inverting an output signal of the fifth NAND gate to output the fifth control signal.

11. The semiconductor memory device of claim 10, wherein each of the first to fourth signal generating units for outputting a corresponding output signal performs a logic operation on input signals.

12. The semiconductor memory device of claim 11, wherein the transfer unit includes:
    a first transfer gate for transferring the data loaded on the first global line in response to the first output signal;
    a second transfer gate for transferring the data loaded on the second global line in response to the second output signal;
    a third transfer gate for transferring the data loaded on the third global line in response to the third output signal; and
    a fourth transfer gate for transferring the data loaded on the fourth global line in response to the fourth output signal, wherein the transfer unit outputs the data on a common output node of the first to fourth transfer gates as output data.

13. The semiconductor memory device of claim 1, wherein the test output control unit includes:
    an input unit for receiving a test signal to control an entry of the test mode and the internal mask signal;
    a first latch unit for inverting and latching an output signal of the input unit in synchronization with a read flag signal in order to output a first transfer signal;
    a second latch unit for outputting a second transfer signal by delaying the first transfer signal by one period of the internal clock;
    a third latch unit for outputting a third transfer signal by delaying the second transfer signal by one period of the internal clock;

a N-th latch unit for outputting a N-th transfer signal by delaying a N−1-th transfer signal by one period of the internal clock;

a plurality of transfer gates for transferring the first to N-th transfer signals in response to corresponding additive latency information signals, respectively; and an output unit for outputting a common node signal, which is applied on a common output node of the plurality of the transfer gates, as the output control signal in response to the test signal.

14. The semiconductor memory device of claim 13, wherein the input unit includes:

a first NAND gate for performing a logic operation on the test signal and the internal mask signal; and a first inverter for inverting an output signal of the first NAND gate.

15. The semiconductor memory device of claim 14, wherein the output unit includes:

a second inverter for inverting the test signal; and a first NOR gate for performing a logic operation on the common node signal, which is applied on the common output node of the transfer gates, and an output signal of the second inverter in order to output the output control signal.

16. The semiconductor memory device of claim 15, wherein the first latch unit includes:

a first transfer gate for transferring the output signal of the input unit while the read flag signal is in a logic high level; and a first latch element for outputting the first transfer signal by inverting and latching an output signal of the transfer gate.

17. The semiconductor memory device of claim 16, wherein each of the second to N-th latch unit includes:

a second transfer gate for transferring a corresponding transfer signal in response to a logic low level of the internal clock;

a second latch element for inverting and latching an output signal of the second transfer gate; and a third latch element for outputting a corresponding transfer signal by inverting and latching an output signal of the second latch element in response to a logic high level of the internal clock.

18. The semiconductor memory device of claim 17, wherein each of first to third latch elements includes a cross-coupled inverter.

19. The semiconductor memory device of claim 1, wherein the data output unit includes:

a pipe latch unit for aligning the data outputted from the output data select unit to a serial data; and a driving unit for outputting the serial data to the data pads.

20. The semiconductor memory device of claim 1, further comprising:

an alignment unit for aligning the internal mask signal in order to output alignment mask signals;

a first sense amplifier unit for sensing and amplifying the alignment mask signals and outputting the amplified signals as mask control signals;

a data input unit for converting data inputted from the data pads into an internal voltage level and aligning the converted data in order to output alignment data;

an input data select unit for selectively outputting one from the plurality of the alignment data in response to a plurality of write address information signals;

a second sense amplifier for sensing and amplifying the selected data from the input data select unit and applying the amplified signal to the global lines; and a plurality of write driving units for selectively applying the data, which are loaded on the corresponding global line, to the corresponding data line in response to the mask control signal.

21. A method for driving a semiconductor memory device, comprising:

applying valid data to sixteen global lines by performing a read operation based on a read common in a test mode;

outputting a half of the data loaded on the sixteen global lines in response to a first logic level of an output control signal;

applying the valid data to the sixteen global lines by performing the read operation based on the read common in the test mode; and outputting another half of the data loaded on the sixteen global lines in response to a second logic level of the output control signal.

22. The method of claim 21, further comprising:

applying a signal through a data mask pad when the read command is applied to the semiconductor memory device; and outputting the output control signal by delaying the signal, which passes through the data mask pad, by a time corresponding to an additive latency.

* * * * *